United States Patent
Lai et al.

(10) Patent No.: US 7,106,563 B2
(45) Date of Patent: Sep. 12, 2006

(54) ELECTROSTATIC DISCHARGE PROTECTION CIRCUIT COUPLED ON I/O PAD

(75) Inventors: Chun Hsiang Lai, Taichung (TW); Meng Huang Liu, Chu-Tung (TW); Tao Cheng Lu, Koashiung (TW)

(73) Assignee: MAXRONIX International Co., Ltd., Hsinchu (TW)

( * ) Notice: Subject to any disclaimer, the term of this patent is extended or adjusted under 35 U.S.C. 154(b) by 211 days.

(21) Appl. No.: 10/826,725

(22) Filed: Apr. 15, 2004

(65) Prior Publication Data

US 2004/0195629 A1  Oct. 7, 2004

Related U.S. Application Data

(62) Division of application No. 09/801,350, filed on Mar. 7, 2001.

(30) Foreign Application Priority Data

Jan. 5, 2001 (TW) .............................. 90100247 A

(51) Int. Cl.
*H02H 9/00* (2006.01)
*H02H 3/22* (2006.01)
*H02H 3/20* (2006.01)
*H02H 9/04* (2006.01)

(52) U.S. Cl. .................... 361/56; 361/111; 361/91.1
(58) Field of Classification Search ............... 361/56, 361/111, 91.1
See application file for complete search history.

(56) References Cited

U.S. PATENT DOCUMENTS

| 5,869,873 | A | * | 2/1999 | Yu | ............................. 257/362 |
| 6,031,405 | A | * | 2/2000 | Yu | ............................. 327/313 |
| 2001/0007521 | A1 | * | 7/2001 | Chen | ........................... 361/56 |

* cited by examiner

Primary Examiner—Brian Sircus
Assistant Examiner—Dharti H. Patel
(74) Attorney, Agent, or Firm—J.C. Patents

(57) ABSTRACT

An I/O pad ESD protection circuit is composed of a SCR circuit, a first diode, a second diode, and an anti-latch-up circuit. The SCR circuit has a first connection terminal and a second connection terminal, respectively coupled to the I/O pad and the ground voltage, so as to discharge the electrostatic charges. The anti-latch-up circuit has two terminals, which are respectively coupled to the voltage source and the ground voltage, and another connection terminal, used to send an anti-latch-up signal to the SCR for changing the activating rate. The latch-up phenomenon is avoided.

8 Claims, 10 Drawing Sheets

US 7,106,563 B2
ELECTROSTATIC DISCHARGE PROTECTION CIRCUIT COUPLED ON I/O PAD

CROSS-REFERENCE TO RELATED APPLICATION

This application is a divisional application of, and claims the priority benefit of, U.S. application Ser. No. 09/801,350 filed on Mar. 7, 2001.

BACKGROUND OF THE INVENTION

1. Field of Invention

The present invention relates to an electrostatic discharge (ESD) protection circuit coupled on an I/O pad. More particularly, the present invention relates to an ESD circuit on the I/O pad which can prevent a silicon controlled rectifier (SCR) circuit from being latched.

2. Description of Related Art

FIG. 1 is a circuit diagram, illustrating a conventional I/O pad ESD protection circuit. When the voltage from the I/O pad 10 is exported to an internal circuit 12, an ESD protection circuit usually is involved in design to prevent an over voltage from occurring and affecting the operation of the internal circuit 12. In FIG. 1, two transistors 14 and 16 are included in the design. The two transistors 14 and 16 can discharge electrostatic charges away when the over positive voltage or over negative voltage occur on the I/O pad 10. In addition, a low-voltage triggering silicon-controlled rectifier (LVTSCR) 18 is also included, which is used to further enhance the discharge rate.

FIG. 2 is a cross-sectional view, illustrating a conventional semiconductor structure of the LVTSCR. In FIG. 2, a lateral parasitic NPN bipolar junction transistor 30 is formed due to the first N+ doped region 20, the P-type substrate 24, and the second N+ dope region 22. A vertical parasitic PNP bipolar junction transistor 32 is formed due to the doped region 26, the N well 28, and the P-type substrate 24. The base electrodes of these two bipolar junction transistors 28, 30 are respectively driven each other by a collect electrode of bipolar junction transistors, resulting in a positive feedback loop. The positive feedback loop is shown in FIG. 3A as a pnpn diode structure. The pnpn diode structure in FIG. 3A has I-V curves as shown in FIG. 3B. In FIG. 3B, $I_H$ is the minimum working current to active the pnpn diode. When $I > I_H$, a latch-up would occur, causing the function of the ESD protection circuit to be temporarily or permanently failure. With respect to FIG. 2, when the voltage applied on the I/O pad 10 has an instant over voltage or over current, it then causes the latch-up on the SCR structure, resulting in failure of the ESD protection circuit.

SUMMARY OF THE INVENTION

The invention provides an I/O pad ESD protection circuit with SCR structure to prevent the latch-up from occurring by including an anti-latch-up circuit to control the SCR structure. As a result, the latch-up phenomenon can be effectively avoided.

As embodied and broadly described herein, the invention provides an I/O pad ESD protection circuit, suitable for use on an I/O pad, including a SCR circuit and an anti-latch-up circuit.

The structure of the SCR circuit includes a first connection terminal, a second connection terminal, and a third connection terminal. The first connection terminal and the second connection terminal are respectively connected to the I/O pad and the ground voltage, so as to discharge the electrostatic charges. The anti-latch-up circuit includes a fourth connection terminal, a fifth connection terminal, and a sixth connection terminal, respectively coupled to the voltage source, the ground voltage, and the third connection terminal of the SCR circuit. In this manner, an anti-latch-up signal is issued from the sixth connection terminal, so that the SCR circuit under the normal operation would not be activated and the latch-up of the circuit is avoided. Moreover, when the SCR circuit is experiencing the ESD situation, a trigger signal can be promptly issued, so that the SCR circuit can be activated under the ESD situation. This can prevent the circuit from being damaged by the electrostatic charges.

Further still, the ESD protection circuit includes a first diode and a second diode. The first diode has a first input end and a first output end, respectively coupled to the ground voltage and the I/O pad. The second diode has a second input end and a second output end, respectively coupled to the I/O pad and the voltage source.

In the foregoing, the SCR circuit includes a P-type substrate, an N+ well, a first P+ doped region, a first N+ doped region, a second N+ doped region, a second P+ doped region, and a third N+ doped region.

The N well is formed in the P-type substrate. The first P+ doped region is also formed in the P-type substrate and is coupled to the ground voltage. The first N+ doped region is formed in the P-type substrate at a location adjacent to the first P+ doped region, and is coupled to the ground voltage. The second N+ doped region is formed between the P-type substrate and the N well adjacent to the first N+ doped region, and is coupled to the sixth connection terminal of the anti-latch circuit. The second P+ doped region is formed in the N well adjacent to the second N+ doped region and is coupled to the I/O pad. The third N+ doped region is formed in the N well adjacent to the second P+ doped region, and is coupled to the voltage source.

With respect to the foregoing SCR circuit, the anti-latch-up circuit can be designed by including a capacitor and a resistor. The capacitor has a first contact end and a second contact end, respectively coupled to the second N+ doped region and the ground voltage. The resistor has a first end and a second end, respectively coupled to the voltage source and the second N+ doped region.

Alternatively, the anti-latch-up circuit is designed by including a PMOS transistor, a resistor, and a capacitor. The source region of the PMOS transistor is coupled to the voltage source, and the drain region of the PMOS transistor is coupled to the second N+ doped region. The resistor has a first end and a second end, respectively coupled to a gate electrode of the PMOS transistor and the ground voltage. The capacitor has a first contact end and a second contact end, respectively coupled to the voltage source and the gate electrode of the PMOS transistor.

Moreover, the SCR circuit can also be alternatively designed to be a LVTSCR circuit that can achieve the function of avoiding latch-up by controlling the PMOS transistor at a normal working condition of the integrated circuit. When the ESD phenomenon occurs, the LVTSCR circuit can also control the gate electrode of NMOS transistor to allow the LVTSCR to be easily triggered. The LVTSCR circuit can include a p-type substrate, an N well, a first P+ doped region, a first N+ doped region, a second N+ doped region, a second P+ doped region, and a third N+ doped region, where the first N+ doped region, the second N+ doped region, and the gate electrode form an additional NMOS transistor.

The N well is formed in the P-type substrate. The first P+ doped region is also formed in the P-type substrate and is coupled to the ground voltage. The first N+ doped region is formed in the P-type substrate at a location adjacent to the first P+ doped region, and is coupled to the ground voltage. The second N+ doped region is formed between the P-type substrate and the N well adjacent to the first N+ doped region, and is coupled to the sixth connection terminal of the anti-latch-up circuit. Source/drain regions of the additional NMOS transistor of the LVTSCR is formed between the first N+ doped region and the second N+ doped region. A gate electrode is formed between the source/drain regions, such that the NMOS transistor is formed. The second P+ doped region is formed in the N well at a location adjacent to the second N+ doped region, and is connect to the I/O pad. The third N+ doped region is formed in the N well, adjacent to the second P+ doped region, and is coupled to the voltage source.

With respect to the LVTSCR circuit, the anti-latch-up circuit includes a PMOS transistor, a resistor, and a capacitor. The source region and the drain region of the PMOS transistor are respectively coupled to the voltage source and the second N+ doped region. The resistor has a first end and a second end, respectively coupled to a gate electrode of the PMOS transistor and the ground voltage. The capacitor has a first contact end and a second contact end, respectively coupled to the voltage source and the gate electrode of the PMOS transistor. The gate electrode of the additional NMOS transistor of the LVTSCR circuit and the gate of the PMOS transistor are coupled together also.

Moreover, the SCR circuit can also be designed as a p-type MLSCR that includes a P-type substrate, an N well, a first P+ doped region, a first N+ doped region, a second P+ doped region, a third P+ doped region, and a second N+ doped region. The N well is formed in the P-type substrate, the first P+ doped region is formed in the P-type substrate, coupled to the ground voltage. The first N+ doped region is formed in the P-type substrate, adjacent to the first P+ doped region, coupled to the ground voltage. The second P+ doped region formed between the P-type substrate and the N well, adjacent to the first N+ doped region, coupled to the sixth connection terminal of the anti-latch-up circuit. The third P+ doped region is formed in the N well, adjacent to the second P+ doped region, coupled to the I/O pad. The second N+ doped region is formed in the N well, adjacent to the third P+ doped region, coupled to the voltage source.

With respect to the foregoing SCR circuit, the anti-latch-up circuit can be designed by including a capacitor and a resistor. The resistor has a first end and a second end, respectively coupled to the second P+ doped region and the ground voltage. The capacitor has a first contact end and a second contact end, respectively coupled to the voltage source and the second P+ doped region.

Alternatively, the anti-latch-up circuit can be designed by including an NMOS transistor, a resistor, and a capacitor. The source region of the NMOS transistor is coupled to the ground voltage, and the drain region of the PMOS transistor is coupled to the second P+ doped region. The resistor has a first end and a second end, respectively coupled to the voltage source and a gate electrode of the NMOS transistor. The capacitor has a first contact end and a second contact end, respectively coupled to the gate electrode of the NMOS transistor and the ground voltage.

Moreover, the SCR circuit can also be designed as a p-type LVTSCR, that can not only control the NMOS transistor to avoid latch-up while it is operated at the normal condition, but also control the additional PMOS transistor to let the ESD protection circuit to be much easily triggered.

The p-type LVTSCR includes a P-type substrate, an N well, a first P+ doped region, a first N+ doped region, a second P+ doped region, a third P+ doped region, and a second N+ doped region. The N well is formed in the P-type substrate, and the first P+ doped region is formed in the P-type substrate, coupled to the ground voltage. The first N+ doped region is formed in the P-type substrate, adjacent to the first P+ doped region, coupled to the ground voltage. The second P+ doped region is formed between the P-type substrate and the N well, adjacent to the first N+ doped region, coupled to the sixth connection terminal of the anti-latch-up circuit. The third P+ doped region is formed in the N well, adjacent to the second P+ doped region, coupled to the I/O pad. Source/drain regions of an additional PMOS transistor of the p-type LVTSCR are formed between the second P+ doped region and the third P+ doped region, and a gate electrode is formed between the source/drain regions. The second N+ doped region is formed in the N well, adjacent to the third P+ doped region, coupled to the I/O pad.

With respect to the p-type LVTSCR circuit, the anti-latch-up circuit includes an NMOS transistor, a resistor, and a capacitor. The source region and the drain region of the NMOS transistor are respectively coupled to the ground voltage and the second P+ doped region. The resistor has a first end and a second end, respectively coupled to the voltage source and a gate electrode of the NMOS transistor. The capacitor has a first contact end and a second contact end, respectively coupled to the gate electrode of the NMOS transistor and the ground voltage. The gate electrode of the additional PMOS transistor of the p-type LVTSCR circuit and the gate of the NMOS transistor are coupled together also.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Typically, since the anti-latch-up circuit uses an RC circuit mechanism to judge whether the current status is under a normal operation or an ESD operation, the delay time of the RC circuit is necessary to be controlled at a level of microsecond. Due to this requirement, the RC circuit needs a large device area. If each I/O pad is coupled to one anti-latch-up circuit, this manner would consume the available area and also cause a large RC delay time.

In the invention, I/O pads are coupled to a voltage source Vcc through a diode, and the anti-latch-up circuit is coupled between the voltage source and the ground voltage GND. When an ESD event occurs, the diode is forwardly conducted, thereby to trigger the anti-latch-up circuit. Since the I/O pads are coupled to the voltage source Vcc through diode, only one anti-latch-up circuit is sufficient to be used for the I/O pads through the voltage source Vcc. The layout area is greatly reduced.

When the IC circuit is operated under a normal condition, since the voltage source has a high voltage level, the diode is at an "OFF" status. The RC delay of the anti-latch-up circuit is disconnected from the I/O pad, and therefore the whole operation speed of the IC circuit is not slowed down by the RC delay time.

Figure 1:
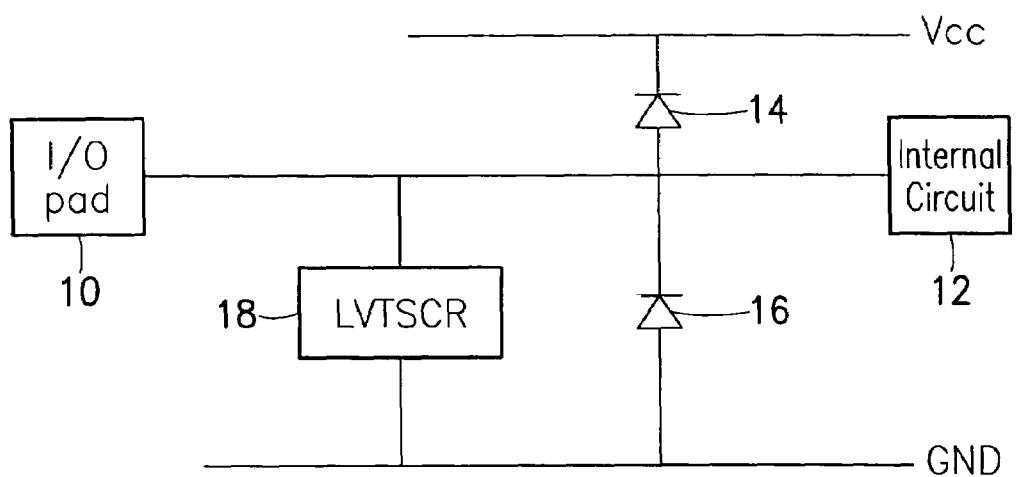
FIG. 1 is a circuit diagram, schematically a conventional I/O pad ESD protection circuit.
Figure 2:
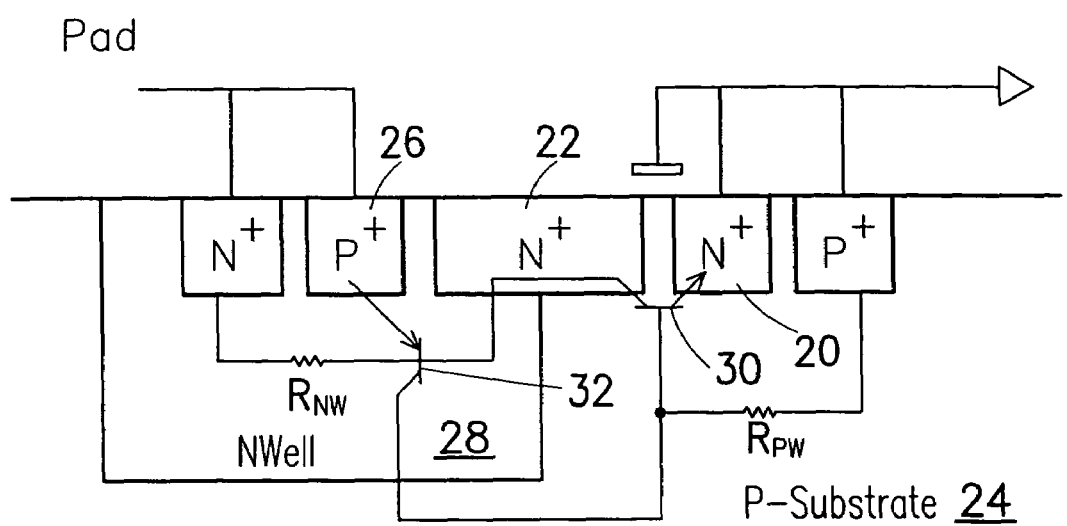
FIG. 2 is a cross-sectional view, illustrating a conventional semiconductor structure of the LVTSCR.
Figure 3A:
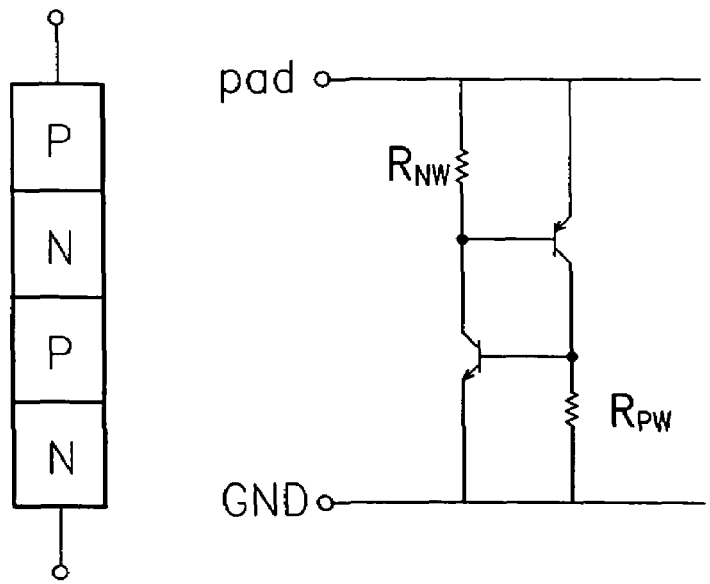
FIGS. 3A and 3B respectively are a pnpn diode structure and it I-V curve.
Figure 3B:
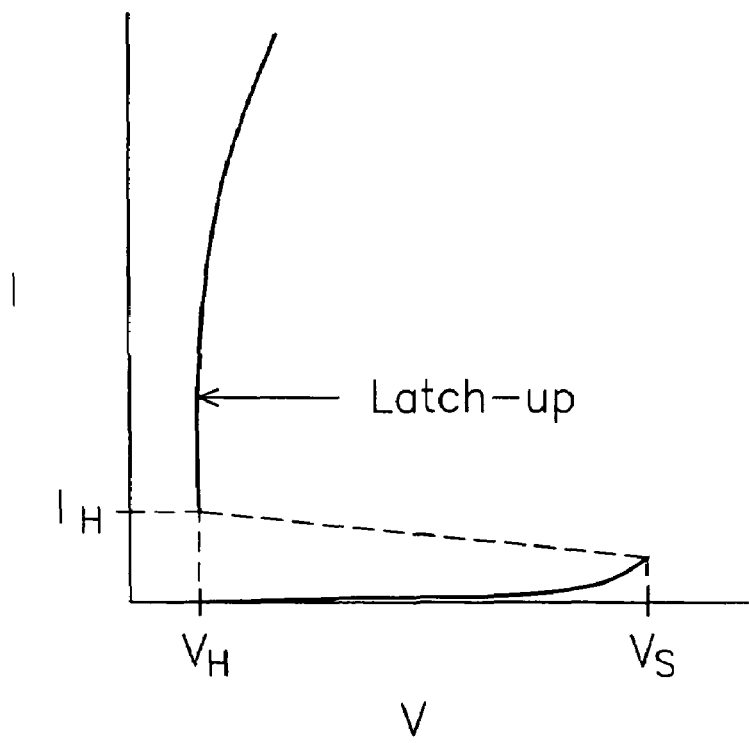
Figure 4:
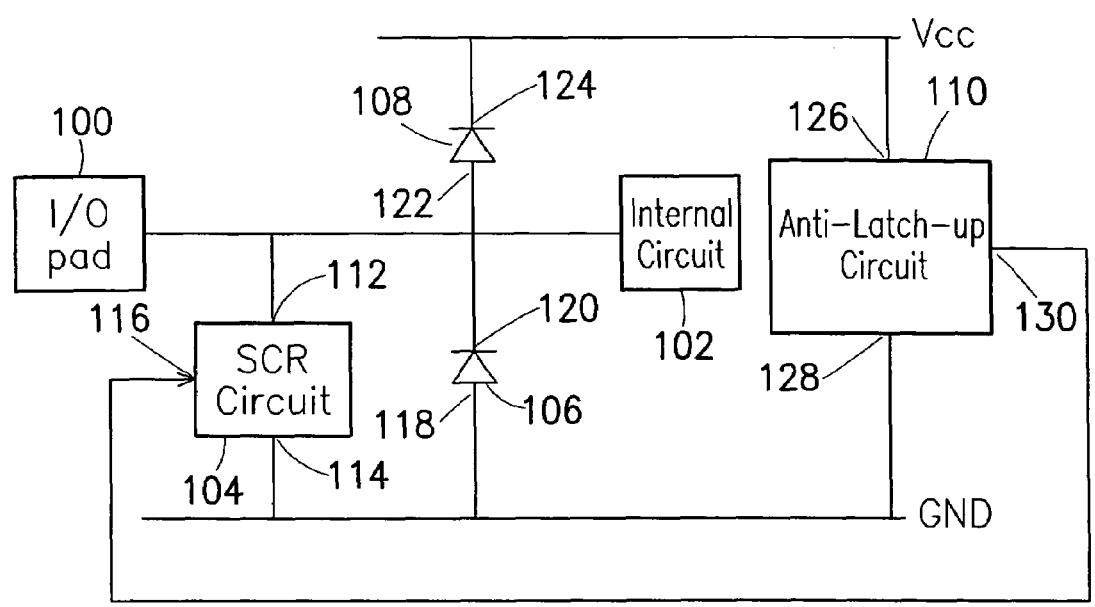
FIG. 4 is a circuit diagram, schematically illustrating an I/O pad ESD protection circuit, according to a preferred embodiment of the invention.

FIG. 4 is a circuit diagram, schematically illustrating an I/O pad ESD protection circuit, according to a preferred embodiment of the invention.

In FIG. 4, the I/O pad ESD protection circuit is coupled between an I/O pad 100 and an internal circuit 102. The I/O pad ESD protection circuit of the invention include a SCR circuit 104, a first diode 106, a second diode 108, and an anti-latch-up circuit 110.

The SCR circuit 104 has a first connection terminal 112 and a second connection terminal 114, respectively coupled to the I/O pad 100 and the ground voltage GND, so as to discharge the electrostatic charges. The first diode 106 has a first end 118 and a second end 120, respectively coupled to the ground voltage GND and the I/O pad 100. When an over negative voltage occurs on the I/O pad 100, it causes a conduction on the diode 106, so as to conduct the electrostatic charges away. The internal circuit 102 is therefore protected from damage. Likewise, the second diode 108 has a first connection terminal 122 and a second connection terminal 124, respectively coupled to the I/O pad 100 and a voltage source Vcc. When an over positive voltage occurs on the I/O pad 100, it causes a conduction on the diode 108. In this situation, the over positive voltage is coupled to the voltage source Vcc through the diode 108, thereby to trigger the anti-latch-up circuit 110. The anti-latch-up circuit 110 then provides a voltage level to the SCR circuit 104 to change the triggering voltage.

The anti-latch-up circuit 110 has a fourth connection terminal 126, a fifth connection terminal 128, and a sixth connection terminal 130, respectively coupled to the voltage source Vcc, the ground voltage GND, and the third connection terminal 116 of the SCR circuit 104. An anti-latch-up signal is issued by the anti-latch-up circuit 110 to the sixth connection terminal 130, so as to prevent the SCR circuit 104 from being activated and latched during an normal operation on the SCR circuit.

To further describe the various circuit designs of the invention, some examples are provided in the following.

EXAMPLE 1

Figure 5A:
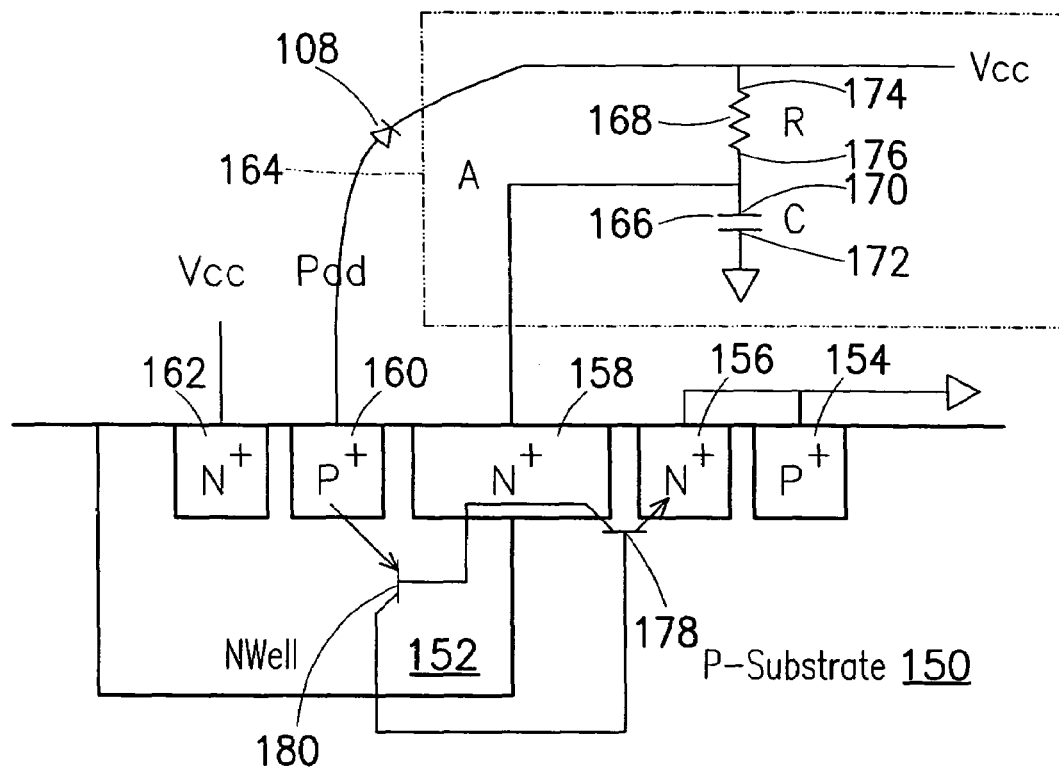
FIGS. 5A–5B are circuit diagrams, schematically the semiconductor structures of the I/O pad ESD protection circuit, according to a first preferred embodiment of the invention.
Figure 5B:
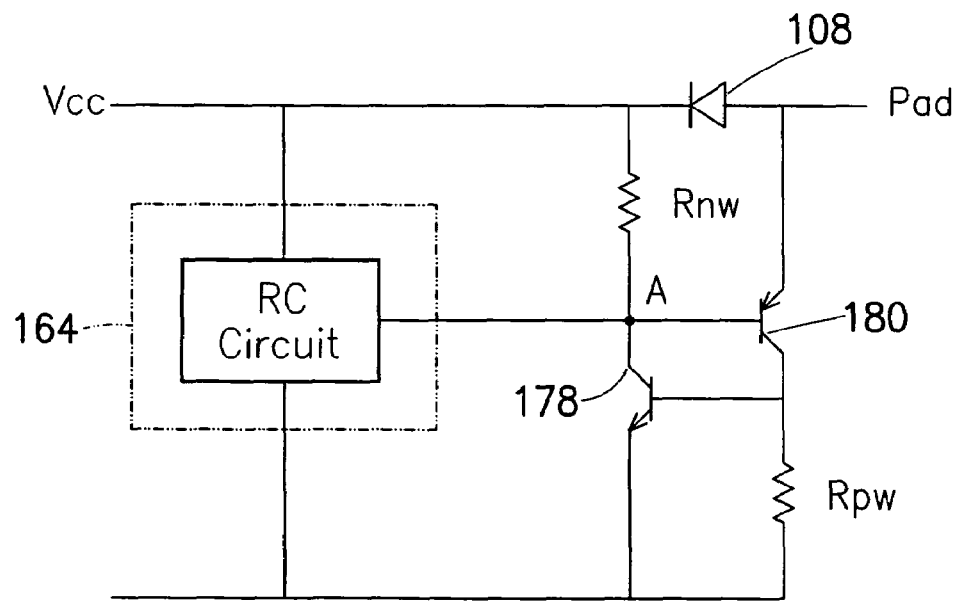

FIGS. 5A–5B are circuit diagrams, schematically the semiconductor structures of the I/O pad ESD protection circuit, according to a first preferred embodiment of the invention. In FIG. 4 as described previously, a relationship between the SCR circuit 104 and the anti-latch circuit 110 has been described, where the diode effect is not well described. In FIG. 5A, the SCR circuit in a semiconductor structure includes a p-type substrate 150, an N well 152, a first P+ doped region 154, a first N+ doped region 156, a second N+ doped region 158, a second P+ doped region 160, and a third N+ doped region 162, where the p-type substrate 150 can also represents a P well.

The N well 152 is formed in the p-type substrate 150. The first P+ doped region 154 is formed in the p-type substrate 150, and is coupled to the ground voltage. The first N+ doped region 156 is formed in the p-type substrate 150 adjacent to the first P+ doped region 154, and is coupled to the ground voltage. The first N+ doped region 156 is formed in the p-type substrate 150, adjacent to the first P+ doped region 154 and coupled to the ground voltage. The second N+ doped region 158 is formed between the p-type substrate 150 and the N well 152, adjacent to the first N+ doped region 156 and coupled to the anti-latch-up circuit 164. The second P+ doped region 160 is formed in the N well 152, adjacent to the second N+ doped region 158 and coupled to the I/O pad. The third N+ doped region 162 is formed in the N well 152, adjacent to the second P+ doped region 160 and coupled to the voltage source Vcc.

In addition, the anti-latch-up circuit 164 includes, for example, a capacitor 166 and a resistor 168. The capacitor 166 has a first contact end 170 and a second contact end 172, respectively coupled to the N+ doped region 158 and the ground voltage. The resistor 168 has a first end 174 and a second end 176, respectively coupled to the voltage source Vcc and the second N+ doped region 158.

In FIG. 5A, the first N+ doped region 156, the p-type substrate 150, and the second N+ doped region 158 form an NPN bipolar junction transistor 178. Likewise, the second P+ doped region 160, the N well 152, and the p-type substrate 150 form a PNP bipolar junction transistor 180. The equivalent SCR circuit of the SCR structure in FIG. 5A is shown in FIG. 5B.

Moreover, the operation mechanism of ESD and its design is considered. Since the typical rising time of an IC device after power-on is about millisecond while the ESD pulse has a rising time of about nanosecond, the RC delay time is then designed to have at about microsecond, so as to discern the two situations. When the IC power is normally turned on, since its the rising time is greater than the designed RC rising time, a voltage level of the node A changes with the voltage source Vcc. At this current situation, the second N+ doped region can absorb large amount of carriers due to an accident over voltage. As a result, the voltage can remain the same, and the latch-up phenomenon is avoided. For the ESD event, since the rising time of the ESD event is less than the designed RC delay time, the voltage level at the node A cannot race the voltage source Vcc in time. An over voltage does not occur on the second N+ doped region. The SCR circuit can be triggered and has a relatively lower voltage.

Moreover, the operation of the SCR circuit associating with the anti-latch-up circuit is described. When the I/O pad is at a normal working voltage, the rising time of power-on usually needs a time much longer than the RC delay time. The node A located between the resistor 168 and the capacitor 170 has a voltage level up to the voltage source Vcc. This provides a protection effect similar to the function of guard ring, such that a holding voltage of the SCR circuit can enhance the prevention of the latch-up phenomenon. When an ESD event occurs on the I/O pad causing a positive current, the voltage level on the node A cannot race the rising rate of the voltage source Vcc due to the rising time of the ESD event is much smaller than the rising time of the RC circuit. As a result, the SCR circuit has a relative lower holding voltage.

EXAMPLE 2

Figure 6A:
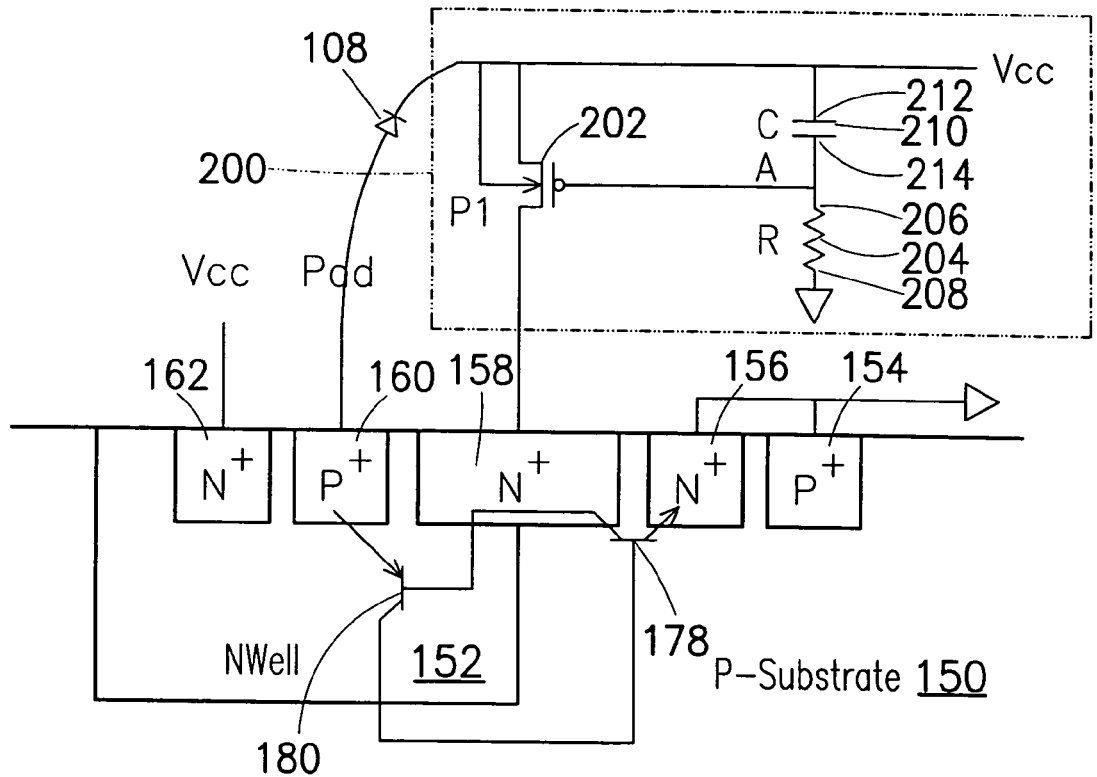
FIGS. 6A–6B are circuit diagrams, schematically the semiconductor structures of the I/O pad ESD protection circuit, according to a second preferred embodiment of the invention.
Figure 6B:
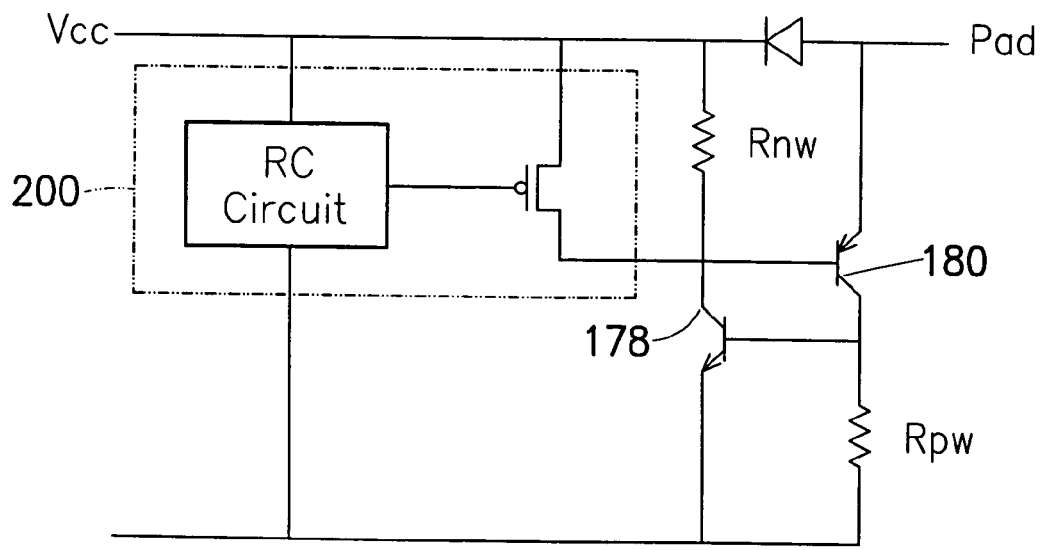

FIGS. 6A–6B are circuit diagrams, schematically the semiconductor structures of the I/O pad ESD protection circuit, according to a second preferred embodiment of the invention. In this Example 2, the SCR circuit remain the same. In the following, the same numeral reference represent the similar element. The description about SCR circuit is skipped here. The difference of the anti-latch-up circuit 200 from the Example 1 is the additional PMOS transistor 202 that has a source region coupled to the voltage source Vcc, a drain region coupled to the second N+ doped region 158, and a resistor 204 with a first end 206 and a second end 208, respectively coupled to a gate electrode of the PMOS transistor 202 and the ground voltage. In addition, a capacitor 210 has a first contact end 212 and a second contact end 214, respectively coupled to the voltage source Vcc and the gate of the PMOS transistor 202.

Similarly to the Example 1, the RC delay time of the anti-latch-up circuit is about the level of microsecond, which is used to distinguish between the ESD rising time at the level of nanosecond and the rising time of the power-on at the level of millisecond.

While the circuit is normally working under power-on, the rising time of power on is larger than the RC time constant of the anti-latch-up circuit, the voltage level on the node A is brought down to the ground voltage GND, causing the activation of the PMOS transistor 202. The second N+ doped region 158 is brought up to voltage source Vcc through the PMOS transistor 202. This provides a guard ring protection effect, and the holding voltage of the SCR circuit is raised, so that the latch-up phenomenon is effectively prevented. When an ESD event occurs on the I/O pad, the second diode 108 is conducted and the rising time of the ESD event is much smaller than the RC time constant of the anti-latch-up circuit. The node A is coupled to the voltage source Vcc through the capacitor 210, causing an "OFF" of the PMOS transistor 202. As a result, the second N+ doped region 158 is at a floating status, and the SCR circuit has a lower holding voltage level.

EXAMPLE 3

Figure 7A:
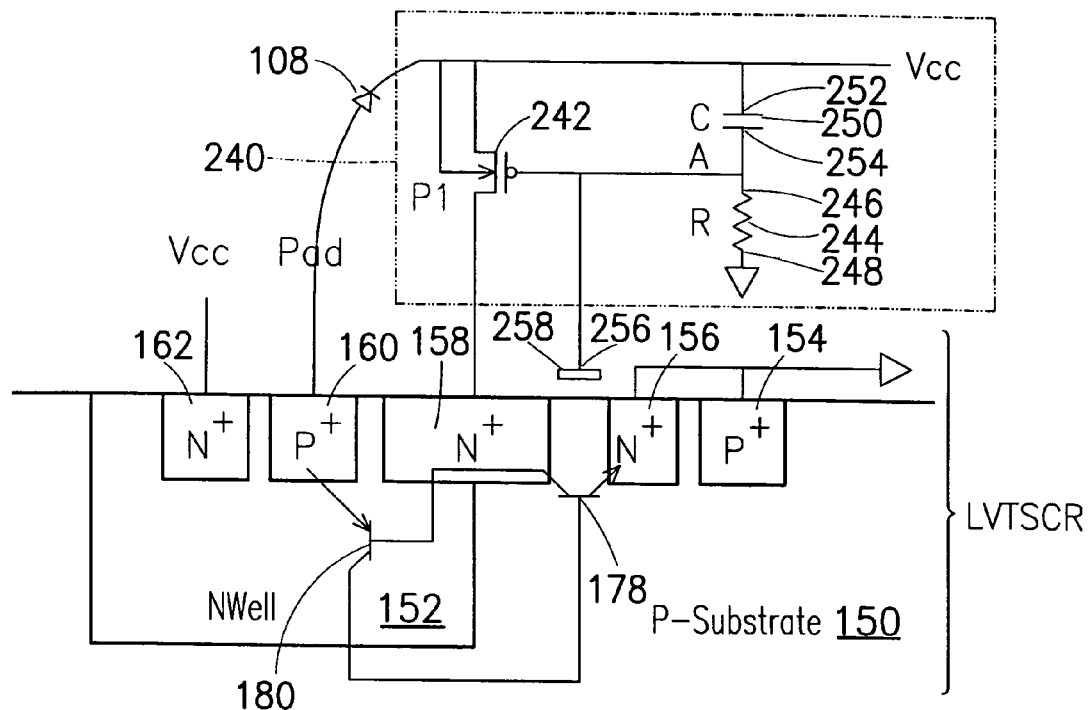
FIGS. 7A–7B are circuit diagrams, schematically the semiconductor structures of the I/O pad ESD protection circuit, according to a third preferred embodiment of the invention.
Figure 7B:
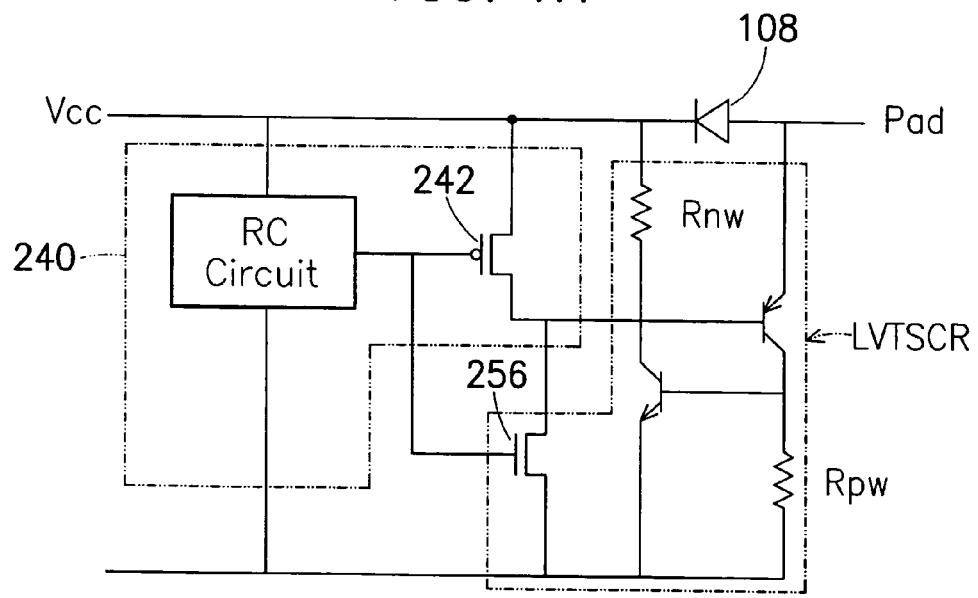

FIGS. 7A–7B are circuit diagrams, schematically the semiconductor structures of the I/O pad ESD protection circuit, according to a third preferred embodiment of the invention. In this Example 3, the SCR circuit is modified into a LVTSCR circuit. Comparison with the SCR circuit in Example 2 as shown in FIGS. 6A–6B, the LVTSCR circuit includes an additional NMOS transistor 256.

The LVTSCR circuit includes in a semiconductor structure includes a p-type substrate 150, an N well 152, a first P+ doped region 154, a first N+ doped region 156, a second N+ doped region 158, a second P+ doped region 160, and a third N+ doped region 162, where the p-type substrate 150 can also represents a P well.

The N well 152 is formed in the p-type substrate 150. The first P+ doped region 154 is formed in the p-type substrate 150, and is coupled to the ground voltage. The first N+ doped region 156 is formed in the p-type substrate 150 adjacent to the first P+ doped region 154, and is coupled to the ground voltage. The second N+ doped region 158 is formed between the p-type substrate 150 and the N well 152, adjacent to the first N+ doped region 156 and coupled to the sixth connection terminal of the anti-latch-up circuit 240, that is, the drain region of the PMOS transistor 242. Between the first N+ doped region 156 and the second N+ doped region 158, the additional NMOS transistor 256 of the LVTSCR circuit is formed. The additional NMOS transistor 256 has source/drain regions and a gate electrode 258 between the source/drain regions. The second P+ doped region 160 is formed in the N well 152, adjacent to the second N+ doped region 158 and coupled to the I/O pad. The third N+ doped region 162 is formed in the N well 152, adjacent to the second P+ doped region 160 and coupled to the voltage source Vcc.

The anti-latch-up circuit 240 with respect to the LVTSCR circuit includes a PMOS transistor 242, a resistor 244 and a capacitor 250. The PMOS transistor 242 has a source region coupled to the voltage source Vcc and a drain region coupled to the second N+ doped region 158. The resistor 244 has a first end 246 and a second end 248, respectively coupled to a gate electrode of the PMOS transistor 242, and the ground voltage. A capacitor 250 having a first contact end 252 and a second contact end 254, respectively coupled to the voltage source and the gate electrode of the PMOS transistor 242. The gate electrode 258 of the NMOS transistor 256 of the LVTSCR circuit is also coupled to the gate electrode of the PMOS transistor 242.

Similarly to the Example 1, the RC delay time of the anti-latch-up circuit is about the level of microsecond, which is used to distinguish between the ESD rising time at the level of nanosecond and the rising time of the power-on at the level of millisecond.

While the circuit is normally working under power-on, the rising time of power on is larger that the RC time constant of the anti-latch-up circuit, the voltage level on the node A is brought down to the ground voltage GND through the resistor 244, causing the activation of the PMOS transistor 242. The second N+ doped region 158 is brought up to voltage source Vcc through the PMOS transistor 242. This provides a guard ring protection effect, and the holding voltage of the SCR circuit is raised, so that the latch-up phenomenon is effectively prevented. In the mean time, the NMOS transistor 256 is at the "OFF" status, so that it does not affect the other operation. When an ESD event occurs on the I/O pad, the second diode 108 is conducted and the rising time of the ESD event is much smaller than the RC time constant of the anti-latch-up circuit. The node A is coupled to the voltage source Vcc through the capacitor 250, causing an "OFF" of the PMOS transistor 242. As a result, the second N+ doped reason 158 is at a floating status, and the SCR circuit has a lower holding voltage level. Since the node A has the voltage level of the voltage source Vcc, the gate electrode of the NMOS transistor 256 is coupled to the voltage source Vcc. This results in a decrease of the triggering voltage and the SCR circuit can be more promptly activated.

EXAMPLE 4

Figure 8A:
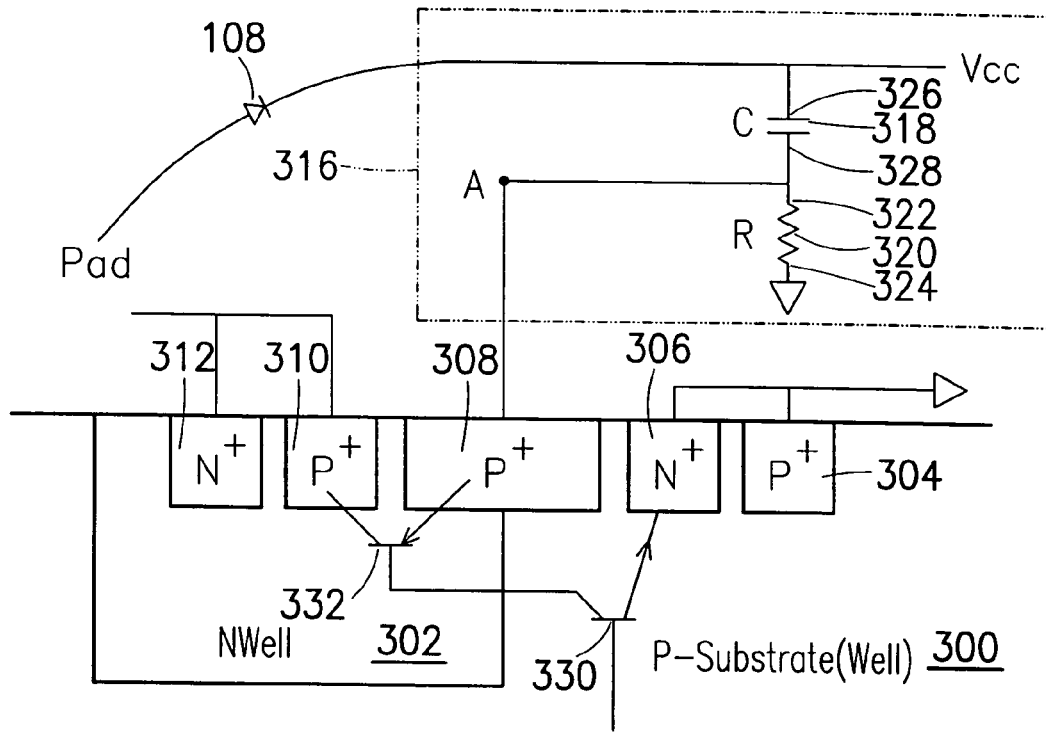
FIGS. 8A–8B are circuit diagrams, schematically the semiconductor structures of the I/O pad ESD protection circuit, according to a fourth preferred embodiment of the invention.
Figure 8B:
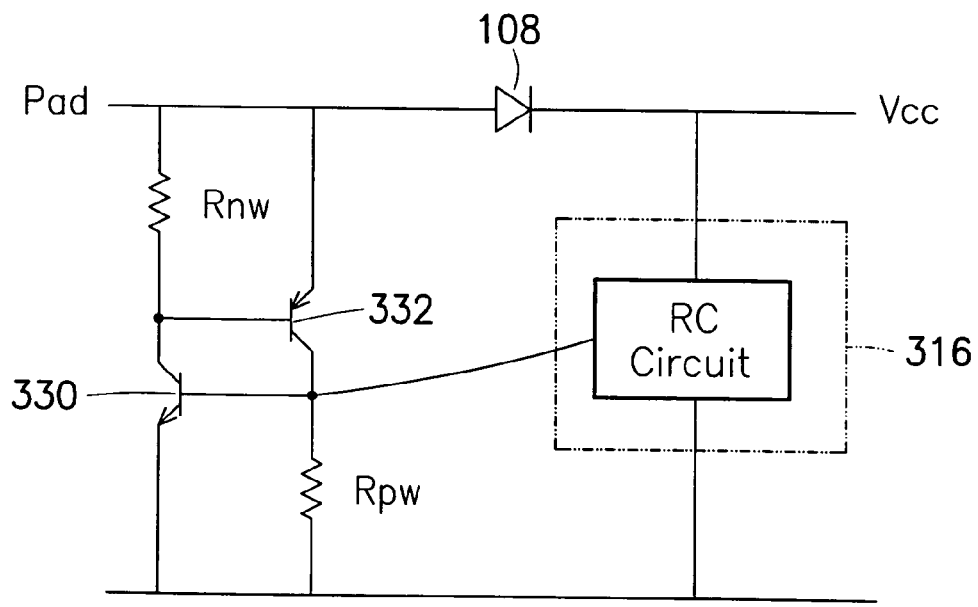

FIGS. 8A–8B are circuit diagrams, schematically the semiconductor structures of the I/O pad ESD protection circuit, according to a fourth preferred embodiment of the invention. In this Example 4, the relation between the SCR circuit 104 and the anti-latch-up circuit 130 and the second diode 108 in FIG. 4 are shown, where the first diode 106 is omitted here. In FIG. 8A, the SCR circuit in a semiconductor structure includes a p-type substrate 300, an N well 302, a first P+ doped region 304, a first N+ doped region 306, a second P+ doped region 308, a third P+ doped region 310, and a second N+ doped region 312, where the p-type substrate 150 can also represents a P well.

The N well 302 is formed in the p-type substrate 300. The first P+ doped region 304 is formed in the p-type substrate 300, and is coupled to the ground voltage. The first N+ doped region 306 is formed in the p-type substrate 300 adjacent to the first P+ doped region 304, and is coupled to the ground voltage. The second P+ doped region 308 is formed between the p-type substrate 300 and the N well 302, adjacent to the first N+ doped region 306 and coupled to an anti-latch-up circuit 316. The third P+ doped region 310 is in the N well 302, adjacent to the second P+ doped region 308 and coupled to the I/O pad. The second N+ doped region 312 is formed in the N well 302, adjacent to the second P+ doped region 310 and coupled to the I/O pad.

The anti-latch-up circuit 316 includes a capacitor 318 and a resistor 320. The resistor 320 has a first end 322 and a second end 324, respectively coupled to the second P+ doped region 308 and the ground voltage. The capacitor 318 has a first contact end 326 and a second contact end 328, respectively coupled to the voltage source Vcc and the second P+ doped region 308.

In FIG. 8A, the first N+ doped region 306, the p-type substrate 300, and the N well 302 form an NPN bipolar junction transistor 330. Likewise, the second P+ doped region 308, the N well 302, and the third P+ doped region 310 form a PNP bipolar junction transistor 332. The equivalent SCR circuit of the SCR structure in FIG. 8A is shown in FIG. 8B.

Moreover, the operation mechanism of ESD and its design is considered. Since the typical rising time of an IC device after power-on is about millisecond while the ESD pulse has a rising time of about nanosecond, the RC delay time is then designed to have at about microsecond, so as to discern the two situations. When the IC power is normally turned on, since its rising time is greater than the designed RC rising time, a voltage level of the node A has the ground voltage GND through the resistor 320. At this current situation, the second p+ doped region can absorb large amount of carriers due to an accident over voltage. As a result, the voltage can remain the same, and the latch-up phenomenon is avoided. For the ESD event, since the rising time of the ESD event is less than the designed RC delay time, the voltage level at the node A is coupled to the voltage source Vcc through the capacitor 318. As a result, the second P+ doped region has a voltage level greater than the ground voltage GND, and thereby the SCR circuit can be triggered with a lower holding voltage.

Moreover, the operation of the SCR circuit associating with the anti-latch-up circuit is described. When the I/O pad is at a normal working voltage, the rising time of power-on usually needs a time much longer than the RC delay time. The node A located between the resistor 320 and the capacitor 318 has a voltage level down to the ground voltage GND, and causing the voltage level of the coupled second P+ doped region 308 to be brought down to the ground voltage GND. This provides a protection effect similar to the function of guard ring, such that a holding voltage of the SCR circuit increases and can enhance the prevention of the latch-up phenomenon. When an ESD event occurs on the I/O pad, since the diode 108 is conducted and the rising time of the ESD event is much smaller than the RC time constant of the anti-latch-up circuit, the voltage level on the node A is near the voltage source Vcc. Therefore, the second P+ doped region has the voltage level greater then the ground voltage, and the SCR circuit has a lower holding voltage.

EXAMPLE 5

Figure 9A:
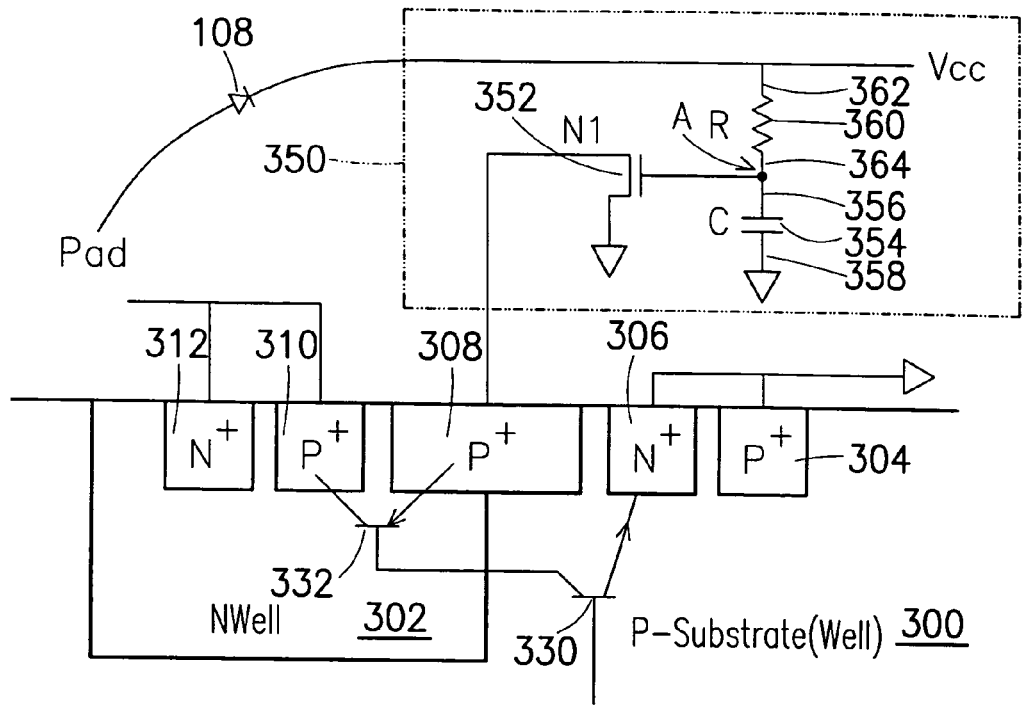
FIGS. 9A–9B are circuit diagrams, schematically the semiconductor structures of the I/O pad ESD protection circuit, according to a fifth preferred embodiment of the invention.
Figure 9B:
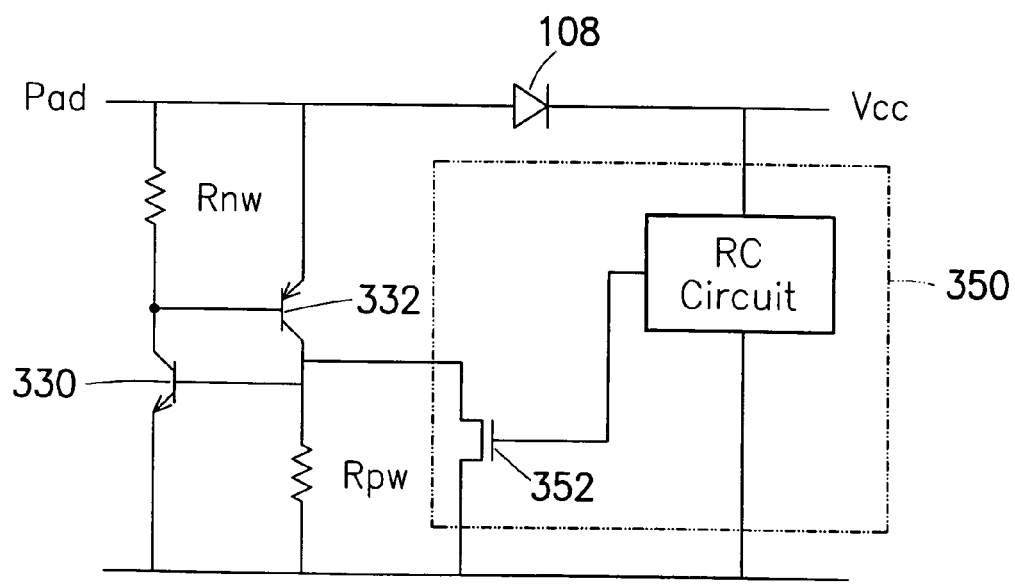

FIGS. 9A–9B are circuit diagrams, schematically the semiconductor structures of the I/O pad ESD protection circuit, according to a fifth preferred embodiment of the invention. In this Example 5, the SCR circuit is similar to that in Example 4 and is not further described. The difference from the Example 4 is the anti-latch-up circuit 350 which includes an additional NMOS transistor 352. The NMOS transistor has a source region grounded to the ground voltage GND, a drain region coupled to the second P+ doped region 308. An capacitor 354 has a first contact end 356 and a second contact end 358, respectively coupled to a gate electrode of the NMOS transistor 352 and the ground voltage GND. A resistor 360 has a first end 362 and a second end 364, respectively coupled to the voltage source Vcc and the gate electrode of the NMOS transistor 352.

While the power is turned on under the normal operation, since the RC circuit has a RC time constant is smaller than the rising time of power-on, the node A then can reach a voltage level of the voltage source Vcc. This turns on the NMOS transistor 352 and the second P+ doped region 308 is brought down to the ground voltage GND. This provides a guarding ring like protection effect and the holding voltage of the SCR circuit is raised, so as to avoid the latch-up phenomenon. When the ESD event occurs on the I/O pad, since the RC time constant is much larger than the rising time of the ESD event, the voltage level at the node A is behind the voltage source Vcc. The second P+ doped region therefore is at a floating status due to the "OFF" status of the NMOS transistor 352. The SCR circuit is then has lower holding voltage.

EXAMPLE 6

Figure 10A:
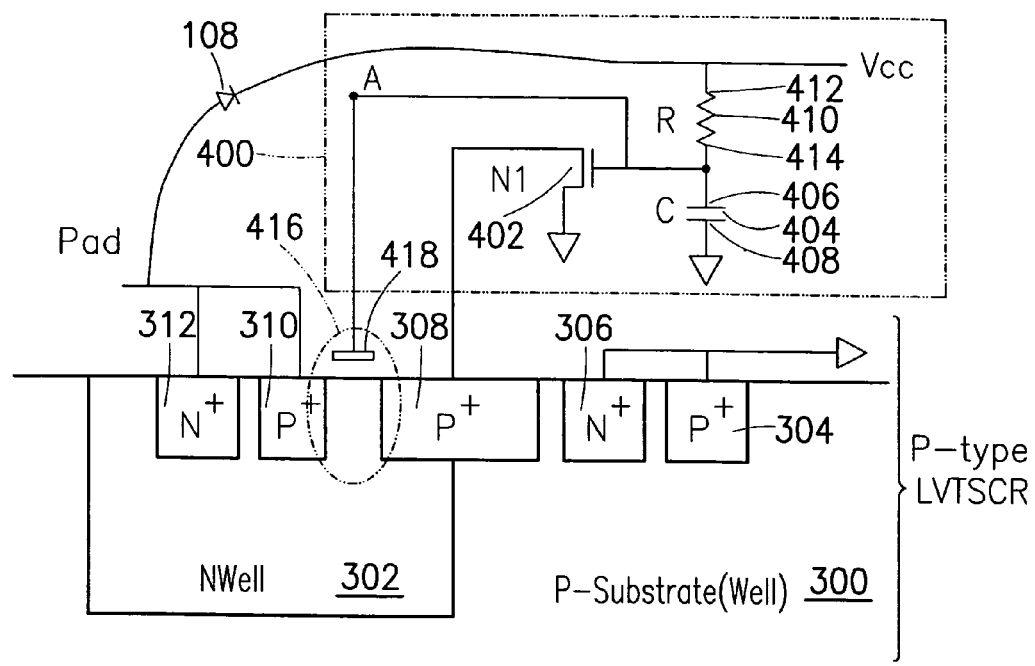
FIGS. 10A–10B are circuit diagrams, schematically the semiconductor structures of the I/O pad ESD protection circuit, according to a sixth preferred embodiment of the invention.
Figure 10B:
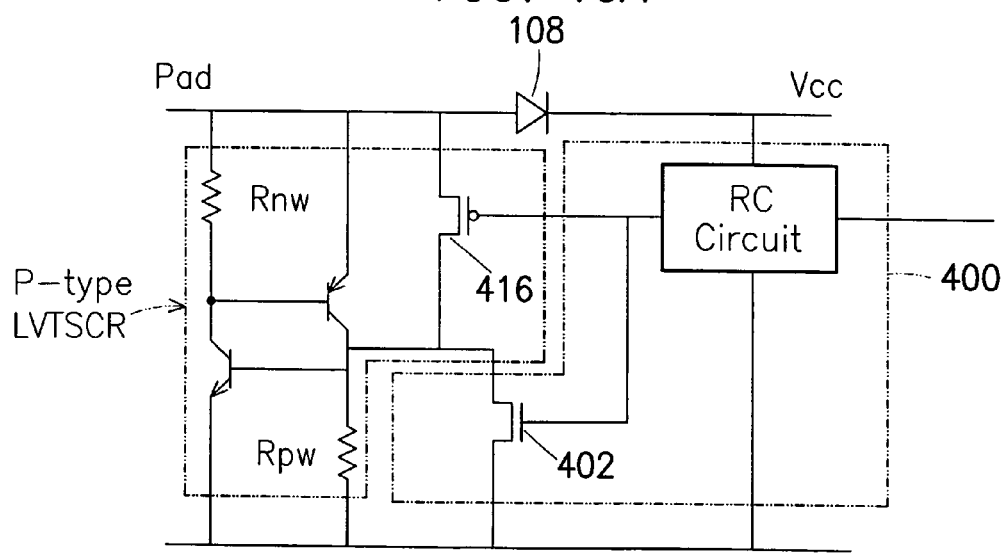

FIGS. 10A–10B are circuit diagrams, schematically the semiconductor structures of the I/O pad ESD protection circuit, according to a sixth preferred embodiment of the invention.

The SCR circuit now is replaced by a p-type LVTSCR circuit, which includes an additional PMOS transistor 416 to the LVTSCR circuit in Example 5.

The p-type LVTSCR circuit includes a p-type substrate 300, an N well 302, a first P+ doped region 304, a first N+ doped region 306, a second P+ doped region 308, a third P+ doped region 310, and a second N+ doped region 312, where the p-type substrate 150 can also represents a P well.

The N well 302 is formed in the p-type substrate 300. The first P+ doped region 304 is formed in the p-type substrate 300, and is coupled to the ground voltage. The first N+ doped region 306 is formed in the p-type substrate 300 adjacent to the first P+ doped region 304, and is coupled to the ground voltage. The second P+ doped region 308 is formed between the p-type substrate 300 and the N well 302, adjacent to the first N+ doped region 306 and coupled to a sixth connection terminal of an anti-latch-up circuit 400, that is, a drain region of the NMOS transistor 402. The third P+ doped region 310 is in the N well 302, adjacent to the second P+ doped region 308 and coupled to the I/O pad. Between the second P+ doped region 308 and the third P+ doped region 310, the PMOS transistor 416 of the p-type LVTSCR circuit is formed. The PMOS transistor 416 has source/drain regions and a gate 418 between the source/drain regions. The second N+ doped region 312 is formed in the N well 302, adjacent to the third P+ doped region 310, and coupled to the I/O pad.

The anti-latch-up circuit 400 with respect to the p-type LVTSCR circuit includes an NMOS transistor 402, a capacitor 404, and a resistor 410. The NMOS transistor 402 has a source region coupled to the ground voltage and a drain region coupled to the second P+ doped region 308. The capacitor having a first contact end 406 and a second contact end 408, respectively coupled to the gate electrode of the NMOS transistor 402 and the ground voltage. The resistor 410 has a first end 412 and a second end 414, respectively coupled to the voltage source Vcc and the gate electrode of the NMOS transistor 402. The gate electrode of the PMOS transistor 416 of the p-type LVTSCR circuit is also coupled to the gate electrode of the NMOS transistor 402.

While the power is turned on under the normal operation, since the RC circuit has a RC time constant is smaller than the rising time of power-on, the node A then can reach a voltage level of the voltage source Vcc. This turns on the NMOS transistor 402 and the second P+ doped region 308 is brought down to the ground voltage GND. This provides a guarding ring like protection effect and the holding voltage of the SCR circuit is raised, so as to avoid the latch-up phenomenon. In the mean time, the PMOS transistor 416 remains at "OFF" status and does not affects the other operation. When the ESD event occurs on the I/O pad, since the RC time constant is much larger than the rising time of the ESD event, the voltage level at the node A is behind the voltage source Vcc, and then the NMOS transistor 402 is at "OFF" status. The second P+ doped region 308 is then at a floating state, and the SCR circuit has a lower holding voltage. Since the node A is coupled to the ground voltage, the gate electrode 418 of the additional PMOS transistor 416 of the p-type LVTSCR circuit is coupled to the ground voltage and lowering the triggering voltage. Therefore the SCR circuit has a fast triggering speed.

In conclusion, the invention uses a anti-latch-up circuit, coupled between the voltage source and the ground voltage, so that the latch-up phenomenon under the normal operation is avoided. When an ESD event occurs, the SCR circuit can be activated with prompt performance.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

The invention claimed is:

1. An electrostatic discharge (ESD) protection circuit, suitable for use on the I/O pad, the ESD protection circuit comprising: a silicon controlled rectifier (SCR) circuit, which comprises a first connection terminal, a second connection terminal, and a third connection terminal, wherein the first connection terminal and the second connection terminal are respectively connected to the I/O pad and a ground voltage, so as to discharge the electrostatic charges; and an anti-latch-up circuit, which comprises a fourth connection terminal, a fifth connection terminal, and a sixth connection terminal, respectively coupled to a voltage source, the ground voltage, and the third connection terminal of the SCR circuit, whereby when a to-be-protected IC is powered by the voltage source, an anti-latch-up signal is sent from the sixth connection terminal, so that the SCR circuit is not unexpectedly activated, causing latch-up of the ESD protection circuit; wherein the SCR circuit comprises: a P-type substrate; an N well, formed in the p-type substrate; a first P+ doped region, formed in the P-type substrate and coupled to the ground voltage; a first N+ doped region, formed in the P-type substrate, adjacent to the first P+ doped region, and coupled to the ground voltage; a second N+ doped region, formed between the P-type substrate and the N well, adjacent to the first N+ doped region, and coupled to the sixth connection terminal of the anti-latch-up circuit; a second P+ doped region, formed in the N well, adjacent to the second N+ doped region, and coupled to the I/O pad; and a third N+ doped region, formed in the N well, adjacent to the second P+ doped region, and coupled to the voltage source; wherein the anti-latch-up circuit comprises: a PMOS transistor, having a gate electrode, a source region coupled to the voltage source, and a drain region coupled to the second N+ doped region; a resistor, having a first end and a second end, respectively coupled to the gate electrode of the PMOS transistor and the ground voltage; and a capacitor, having a first contact end and a second contact end, respectively coupled to the voltage source and the gate electrode of the PMOS transistor, wherein the second N+ doped region is the third connection terminal of the SCR circuit, which receives the anti-latch-up signal so as to change a triggering voltage of the SCR circuit for preventing its latch-up when the to-be-protected IC is powered by the voltage source.

2. An electrostatic discharge (ESD) protection circuit, suitable for use on the I/O pad, the ESD protection circuit comprising: a silicon controlled rectifier (SCR) circuit, which comprises a first connection terminal, a second connection terminal, and a third connection terminal, wherein the first connection terminal and the second connection terminal are respectively connected to the I/O pad and a ground voltage, so as to discharge the electrostatic charges; and an anti-latch-up circuit, which comprises a fourth connection terminal, a fifth connection terminal, and a sixth connection terminal, respectively coupled to a voltage source, the ground voltage, and the third connection terminal of the SCR circuit, whereby when a to-be-protected IC is powered by the voltage source, an anti-latch-up signal is sent from the sixth connection terminal, so that the SCR circuit is not unexpectedly activated, causing latch-up of the ESD protection circuit; wherein the SCR circuit comprises a low-voltage triggering SCR (LVTSCR) circuit, which comprises: a P-type substrate; an N well, formed in the p-type substrate; a first P+ doped region, formed in the P-type substrate and coupled to the ground voltage; a first N+ doped region, formed in the P-type substrate, adjacent to the first P+ doped region, and coupled to the ground voltage; a second N+ doped region, formed between the P-type substrate and the N well, adjacent to the first N+ doped region, and coupled to the sixth connection terminal of the anti-latch-up circuit, wherein an additional NMOS transistor with a source/drain region and a gate is formed between the first N+ doped region and the second N+ doped region; a second P+ doped region, formed in the N well, adjacent to the second N+ doped region, and coupled to the I/O pad; and a third N+ doped region, formed in the N well, adjacent to the second P+ doped region, and coupled to the voltage source, wherein the second N+ doped region is the third connection terminal of the SCR circuit, which receives the anti-latch-up signal so as to change a triggering voltage of the SCR circuit for preventing its latch-up when the to-be-protected IC is powered by the voltage source.

3. The ESD protection circuit of claim 2, wherein the anti-latch-up circuit comprises: a PMOS transistor, having a gate electrode, a source region coupled to the voltage source, and a drain region coupled to the second N+ doped region; a resistor, having a first end and a second end, respectively coupled to the gate electrode of the PMOS transistor and the ground voltage; and a capacitor, having a first contact end and a second contact end, respectively coupled to the voltage source and the gate electrode of the PMOS transistor, wherein the gate electrode of the additional NMOS transistor of the LVTSCR circuit is also coupled to the gate electrode of the PMOS transistor.

4. An electrostatic discharge (ESD) protection circuit, suitable for use on the I/O pad, the ESD protection circuit comprising: a silicon controlled rectifier (SCR) circuit, which comprises a first connection terminal, a second connection terminal, and a third connection terminal, wherein the first connection terminal and the second connection terminal are respectively connected to the I/O pad and a ground voltage, so as to discharge the electrostatic charges; and an anti-latch-up circuit, which comprises a fourth connection terminal, a fifth connection terminal, and a sixth connection terminal, respectively coupled to a voltage source, the ground voltage and the third connection terminal of the SCR circuit, whereby when a to-be-protected IC is powered by the voltage source, an anti-latch-up signal is sent from the sixth connection terminal, so that the SCR circuit is not unexpectedly activated causing latch-up of the ESD protection circuit, wherein the SCR circuit comprises: a P-type substrate; an N well, formed in the p-type substrate; a first P+ doped region, formed in the P-type substrate and coupled to the ground voltage; a first N+ doped region, formed in the P-type substrate, adjacent to the first P+ doped region, and coupled to the ground voltage; a second P+ doped region, formed between the P-type substrate and the N well, adjacent to the first N+ doped region, and coupled to the sixth connection terminal of the anti-latch-up circuit; a third P+ doped region, formed in the N well, adjacent to the second P+ doped region, and coupled to the I/O pad; and a second N+ doped region, formed in the N well, adjacent to the third P+ doped region, and coupled to the I/O pads wherein the second N+ doped region is the third connection terminal of the SCR circuit, which receives the anti-latch-up signal so as to change a triggering voltage of the SCR circuit for preventing its latch-up when the to-be-protected IC is powered by the voltage source.

5. The ESD protection circuit of claim 4, wherein the anti-latch-up circuit comprises: a capacitor, having a first contact end and a second contact end, respectively coupled to the voltage source and the second P+ doped region; and a resistor, having a first end and a second end, respectively coupled to the second P+ doped region and the ground voltage.

6. The ESD protection circuit of claim 4, wherein the anti-latch-up circuit comprises: an NMOS transistor, having a gate electrode, a source region coupled to the ground voltage, and a drain region coupled to the second P+ doped region; a capacitor, having a first contact end and a second contact end, respectively coupled to the gate electrode of the NMOS transistor and the ground voltage; and a resistor, having a first end and a second end, respectively coupled to the voltage source and the gate electrode of the NMOS transistor.

7. An electrostatic discharge (ESD) protection circuit, suitable for use on the I/O pad, the ESD protection circuit comprising: a silicon controlled rectifier (SCR) circuit, which comprises a first connection terminal, a second connection terminal, and a third connection terminal, wherein the first connection terminal and the second connection terminal are respectively connected to the I/O pad and a ground voltage, so as to discharge the electrostatic charges; and an anti-latch-up circuit, which comprises a fourth connection terminal, a fifth connection terminal, and a sixth connection terminal, respectively coupled to a voltage source, the ground voltage, and the third connection terminal of the SCR circuit, whereby when a to-be-protected IC is powered by the voltage source, an anti-latch-up signal is sent from the sixth connection terminal, so that the SCR circuit is not unexpectedly activated, causing latch-up of the ESD protection circuit; wherein the SCR circuit comprises a p-type low-voltage triggering SCR (LVTSCR) circuit, which comprises: a P-type substrate; an N well, formed in the p-type substrate; a first P+ doped region, formed in the P-type substrate and coupled to the ground voltage; a first N+ doped region, formed in the P-type substrate, adjacent to the first P+ doped region, and coupled to the ground voltage; a second P+ doped region, formed between the P-type substrate and the N well, adjacent to the first N+ doped region, and coupled to the sixth connection terminal of the anti-latch-up circuit; a third P+ doped region, formed in the N well, adjacent to the second P+ doped region, and coupled to the I/O pad, wherein an additional PMOS transistor with a source/drain region and a gate electrode of the p-type LVTSCR circuit is formed between the second P+ doped region and the third P+ doped region; and a second N+ doped region, formed in the N well, adjacent to the third P+ doped region, and coupled to the I/O pad, wherein the second N+ doped region is the third connection terminal of the SCR circuit, which receives the anti-latch-up signal so as to change a triggering voltage of the SCR circuit for preventing its latch-up when the to-be-protected IC is powered by the voltage source.

8. The ESD protection circuit of claim 7, wherein the anti-latch-up circuit comprises: an NMOS transistor, having a gate electrode, a source region coupled to the ground voltage, and a drain region coupled to the second P+ doped region; a capacitor, having a first contact end and a second contact end, respectively coupled to the gate electrode of the NMOS transistor and the ground voltage; and a resistor, having a firsts end and a second end, respectively coupled to the voltage source and the gate electrode of the NMOS transistor, wherein the gate electrode of the additional PMOS transistor of the p-type LVTSCR circuit is also coupled to the gate electrode of the NMOS transistor.

* * * * *

UNITED STATES PATENT AND TRADEMARK OFFICE
CERTIFICATE OF CORRECTION

PATENT NO. : 7,106,563 B2 Page 1 of 1
APPLICATION NO. : 10/826725
DATED : September 12, 2006
INVENTOR(S) : Chun Hsiang Lai et al.

It is certified that error appears in the above-identified patent and that said Letters Patent is hereby corrected as shown below:

In the title page, item (73), please correct Assignee's name from "MAXRONIX International Co., Ltd." to --MACRONIX International Co., Ltd. --

Signed and Sealed this

Twentieth Day of February, 2007

JON W. DUDAS
*Director of the United States Patent and Trademark Office*